US006478828B1

(12) United States Patent
Ninane et al.

(10) Patent No.: US 6,478,828 B1
(45) Date of Patent: Nov. 12, 2002

(54) PROCESS FOR THE CRYSTALLIZATION OF AN INORGANIC SUBSTANCE

(75) Inventors: Léon Ninane, Dombasle-sur-Meurthe; Léopold Detry, Bayonne, both of (FR)

(73) Assignee: Solvay & Cie (Société Anonyme), Brussels (BE)

( * ) Notice: Subject to any disclaimer, the term of this patent is extended or adjusted under 35 U.S.C. 154(b) by 0 days.

(21) Appl. No.: 08/358,974

(22) Filed: Dec. 19, 1994

Related U.S. Application Data

(63) Continuation of application No. 08/064,367, filed on May 21, 1993, now abandoned, which is a continuation of application No. 07/707,966, filed on May 22, 1991, now abandoned, which is a continuation of application No. 07/387,278, filed on Jul. 31, 1989, now abandoned.

(30) Foreign Application Priority Data

Jul. 29, 1988 (FR) ............................................. 88 10402

(51) Int. Cl.[7] ................................................. B01D 9/02

(52) U.S. Cl. ..................... 23/301; 23/303; 23/313 FB; 423/499.4

(58) Field of Search ............................ 423/499.4, 499.5; 23/302 T, 303, 301, 313 FB

(56) References Cited

U.S. PATENT DOCUMENTS

| | | | |
|---|---|---|---|
| 2,164,111 A | 6/1939 | Jeremiassen | ................. 23/301 |
| 2,164,112 A | 6/1939 | Jeremiassen | ................. 422/252 |
| 2,567,968 A | 9/1951 | Saeman | ................. 23/302 R |
| 2,737,451 A | 3/1956 | Saeman | ................. 23/302 A |
| 3,514,263 A | 5/1970 | Maleu | ................. 422/252 |
| 3,627,496 A | * 12/1971 | Herman | ................. 23/301 R |
| 3,800,026 A | * 3/1974 | Morgan | ................. 423/499 |
| 4,797,981 A | 1/1989 | Ninane | ................. 23/303 |
| 4,797,987 A | * 1/1989 | Ninane et al. | ................. 423/499 |

FOREIGN PATENT DOCUMENTS

| | | | |
|---|---|---|---|
| DE | 1258828 | 1/1968 | |
| DE | 244124 | * 3/1987 | ................. 423/499 |
| EP | 83125 | * 7/1983 | ................. 423/499 |
| EP | 016249 | 11/1985 | |
| FR | 617399 | 2/1927 | |
| FR | 648701 | 12/1928 | |
| GB | 392829 | 5/1933 | |
| GB | 418349 | 10/1934 | |
| GB | 2080779 | * 2/1982 | ................. 423/499 |

OTHER PUBLICATIONS

Perry, J.H. "Chemical Engineers' Handbook", McGraw–Hill N.V. 4th Ed 1963 pp 17–20–21 and 20–42–43.*
A.W. Bamforth, "Types of Crystallisers", *The Chemical Engineer*, pp. 443–445 (Jul./Aug. 1974).
J.F. Witte et al., "Two case histories in the design of crystallisers", *British Chemical Engineer*, vol. 16, pp. 681–685 (Aug. 1971).

(List continued on next page.)

*Primary Examiner*—Ngoc-Yen Nguyen
(74) *Attorney, Agent, or Firm*—Venable; Ashley J. Wells

(57) ABSTRACT

A process for crystallization of an inorganic substance includes preparing a supersaturated solution of the inorganic substance to be crystallized in a solvent which is a liquid; forcing a stream of the supersaturated solution upwardly through successively a fluidized bed distributor of a fluidized bed reactor and a bed of crystals arranged above the fluidized bed distributor with a pressure effective to cause fluidization of the bed of crystals, the fluidized bed distributor dividing the stream of supersaturated solution into thin, substantially parallel and vertical jets; maintaining the fluidized bed distributor at a temperature which is uniform and at which the inorganic substance to be crystallized from the supersaturated solution is lower than or equal to the concentration corresponding to saturation; and controlling the temperature of the fluidized bed distributor to cause the stream of supersaturated solution in the fluidized bed distributor to undergo a temperature change which is insufficient to desupersaturate it completely.

14 Claims, 4 Drawing Sheets

OTHER PUBLICATIONS

Theodor Messing et al., "Industrielle Kristallisation—Moderne Grosstechnische Anlagen und Fallstudien" *Chem. Ing. Tech.*, vol. 52, pp. 870–874 (1980). no month.

Hans Svanoe, "'Krystal' Classifying Crystallizer", *Ind. Eng. Chem.*, vol. 32, pp. 636–639 (1940). (no month).

"precis de genie chimique"; J. Giuaudon et al. (no date).

"Fluid Mechanical Description of . . . " G.P. Agarwal et al; 1980.

"Chemical Engineers' Handbook"; J.H. Perry, McGraw–Hill Book Co. (no date).

"Types of Crystallisers"; A.W. Bamforth; The Chemical Engineer, Jul./Aug. 1974.

"Two case histories in the design of crystallisers"; Witte et al. Aug. 1971; vol. 16, No. 8.

Theodor Messing et al., *Chem.–Ing.–Tech.*, "Industrielle Kristallisation—Moderne grosstechnische Anlagen und Fallstudien", Nr. 11, pp. 870–874 (May 1980). no translation.

\* cited by examiner

PROCESS FOR THE CRYSTALLIZATION OF AN INORGANIC SUBSTANCE

This application is a continuation of application Ser. No. 07/707,966, filed May 22, 1991, which is a continuation of application Ser. No. 08/064,367, filed May 21, 1993, which is a continuation of application Ser. No. 07/387,278, filed Jul. 31, 1989 now abandoned.

BACKGROUND OF THE INVENTION

1. Field of the Invention

The present invention relates to a process for the crystallization of an inorganic substance, using a bed of crystals through which passes a solution which is supersaturated with the substance to be crystallized.

2. Description of the Related Art

The "Oslo" crystallizer is a well-known apparatus for the crystallization of inorganic substances (British Chemical Engineering, August 1971, Vol. 16, No. 8, pages 681 to 685; The Chemical Engineer, July/August 1974, pages 443 to 445; British Patent GB-A-418,349). This known apparatus comprises a vertical cylindrical vessel and a vertical tube which is arranged axially in the vessel and which opens in the immediate vicinity of the bottom of the latter; a vertical annular chamber is thus defined between the axial tube and the cylindrical wall of the vessel. In making use of this known apparatus, a bed of crystals is employed in the annular chamber, through which passes a solution supersaturated with the substance which it is desired to crystallize (for example an aqueous solution supersaturated with sodium chloride). This solution is introduced into the apparatus via the axial tube, so that it enters the annular chamber radially, near the bottom of the latter, and subjects the crystals in the bed to a general rotation comprising an upward translation along the wall of the vessel and a downward translation along the axial tube.

In this known apparatus the intention is to produce uniform crystalline particles of spherical shape, whose mean diameter it should be possible to control by an appropriate choice of the dimensions of the apparatus and operating conditions. In practice, however, this known apparatus is ill-suited for obtaining large spherical particles, especially because of the attrition produced within the bed of crystals and of the general rotation to which these are subjected. In particular, in the case of sodium chloride, it does not permit spherical particles greater than 2 or 3 mm in diameter to be produced. Furthermore, an effect of the attrition phenomenon is to give rise to the formation of fines which are entrained out of the bed by the crystallization mother liquor and which must consequently be separated from the mother liquor before the latter is recycled into the apparatus.

The invention is aimed at overcoming this disadvantage, by providing a new process which makes it possible, on the one hand, to crystallize particles which are spherical and of larger diameter and, on the other hand, to reduce the formation of fines.

SUMMARY OF THE INVENTION

Consequently, the invention relates to a process for the crystallization of an inorganic substance, in which use is made of a bed of crystals through which passes a stream of a solution supersaturated with the substance to be crystallized, the bed of crystals being fluidized by passing the supersaturated solution through a distributor which is arranged below the bed of crystals and which is maintained at a temperature at which the concentration of the supersaturated solution does not exceed the concentration corresponding to saturation.

In the process according to the invention, the crystals in the bed act as seeds for the crystallization of the inorganic material by desupersaturation of the supersaturated solution. They are generally small uniform crystals of the inorganic substance which it is intended to crystallize.

The degree of supersaturation of the supersaturated solution depends on various parameters, especially on the nature of the inorganic material, on its temperature and on the possible presence of solid or dissolved impurities. In practice, everything else being equal, it is advantageous to produce a maximum degree of supersaturation, although this must be limited to avoid accidental crystallization on the walls of the crystallization plant, upstream of the crystal bed, as well as primary and secondary seeding within the solution.

The means employed to obtain the supersaturated solution are not critical. The latter may be obtained, for example, by changing the temperature or by partially evaporating a solution saturated beforehand with the substance to be crystallized.

The solvent in the solution is not critical, and water is generally preferred.

The temperature of the supersaturated solution is not critical. In practice, however, it has been observed that the rate of growth of the crystals in the bed is proportionally greater the higher the solution temperature. It is advisable, however, that the solution temperature should remain below its boiling point at the pressure prevailing in the crystallization chamber. For example, in the case where the process is applied to the crystallization of sodium chloride, it is possible advantageously to employ aqueous solutions of sodium chloride with a degree of supersaturation between 0.3 and 0.5 g/kg, at a temperature of between 50 and 110° C. The degree of supersaturation expresses the excess mass of inorganic substance relative to the mass corresponding to the saturation of the solution.

According to the invention, the crystal bed is a fluidized bed, in accordance with the generally accepted definition (Givaudon, Massot et Bensimon—"Précis de génie chimique" (A summary of chemical engineering)—volume 1—Berger-Levrault, Nancy—1960, pages 353 to 370). To fluidize the bed, the stream of the supersaturated solution is passed through a distributor arranged under the crystal bed, in accordance with the usual technology of fluidized bed reactors. The distributor is a fundamental member of the fluidized bed reactors. Its function is to divide the stream of solution into thin jets, preferably parallel and vertical, while furthermore imposing onto it a defined pressure drop, controlled as a function of the bed dimensions, of the nature of the particles forming the bed and of the solution (Ind. Eng. Chem. Fundam.—1980—19—G. P. Agarwal and others—"Fluid mechanical description of fluidized beds. Experimental investigation of convective instabilities in bounded beds"—pages 59 to 66; John H. Perry—Chemical Engineers' Handbook—4th edition—1963—McGraw-Hill Book Company—pages 20.43 to 20.46). It may be, for example, a horizontal plate pierced with uniformly spaced orifices, a grid or a horizontal mesh, or an assembly of vertical nozzles.

In accordance with the invention, the distributor is maintained at a uniform temperature at which the concentration of the supersaturated solution is lower than or equal to the concentration corresponding to saturation. In other words, in the process according to the invention, the temperature of the distributor is different from the temperature of the supersaturated solution upstream of the distributor, and it is chosen so as to make the concentration of the said supersaturated solution lower than or at most equal to the concentration of the saturated solution which is stable at the temperature of the distributor (for the same single inorganic substance and the same single solvent as the supersaturated solution). The crystallization of the inorganic substance on the distributor is thus avoided. The choice of the distributor temperature is critical and depends on the inorganic substance which it is intended to crystallize, the solvent in the solution and the degree of supersaturation. Thus, in the case of a substance whose solubility in the solvent increases with temperature (for example an aqueous solution of sodium or potassium chloride) the temperature must be higher than that of the supersaturated solution. In the case of a substance whose solubility in the solvent varies inversely with temperature (for example an aqueous solution of sodium carbonate monohydrate), the temperature must be lower than that of the supersaturated solution. Furthermore, the choice of the distributor temperature is conditioned by the need to prevent the supersaturated solution coming into contact with it from undergoing an excessive temperature change, which would result in an exaggerated drop in its degree of supersaturation. The temperature of the distributor must consequently be controlled to make the stream of solution in the distributor undergo a temperature change which is insufficient to desupersaturate it completely. In practice, the distributor temperature must be determined in each particular case, especially as a function of the degree of supersaturation of the solution and of the required production efficiency. Its choice will also depend on various factors such as the heat transmission coefficient of the distributor, the flow rate and the temperature of the solution, and its specific heat. In each particular case, the definition of the optimum temperature of the distributor can be determined without difficulty by calculation and experiment.

A substantially saturated mother liquor is collected downstream of the crystal bed. This can be recycled into the process after it has been treated to bring it into a supersaturated state. For this purpose, in a particular embodiment of the process according to the invention, the mother liquor collected downstream of the crystal bed is heated, and a complementary quantity of the inorganic substance which is equal to that which has crystallized in the bed is added to it, and the resulting mixture is then cooled to reconstitute the supersaturated solution. This embodiment of the process applies specifically to the inorganic substances whose solubility in the solvent varies in the same direction as the temperature. The heating of the mother liquor must be sufficient for all the abovementioned complementary quantity of inorganic substance to dissolve therein. The cooling of the mixture can be obtained by circulating it through a heat exchanger or by subjecting it to a decompression, to evaporate it partially. When the cooling is performed by decompression, a complement of solvent should be added to the mother liquor to compensate the quantity evaporated by the decompression.

In a second particular embodiment of the process, applied specifically to the inorganic substances whose solubility in the solvent varies inversely with the temperature, the mother liquor collected downstream of the bed is cooled, a complementary quantity of the inorganic substance which is equal to that which has crystallized is added to it, and it is then heated to reconstitute the supersaturated solution.

The invention also relates to a plant for the cystallization of an inorganic substance according to the process in accordance with the invention, comprising a vertical tubular enclosure, a vertical tube arranged axially in the enclosure and opening in the vicinity of its bottom, so as to define an annular chamber in the enclosure, the tube being joined at its upper end to a device for feeding a solution which is supersatured with the substance to be crystallized; a distributor divides the annular chamber into a lower entry chamber for the supersaturated solution entry and an upper crystallization chamber forming a fluidized bed reactor, the distributor being provided with a thermostat.

In the plant according to the invention, the function of the thermostat is to maintain the distributor at a uniform temperature, controlled as a function of that of the supersaturated solution employed, to prevent a spontaneous crystallization of the inorganic substance in contact with the distributor. The thermostat may accordingly comprise a means for heating or a means for cooling the distributor, depending on whether the plant is intended for the treatment of supersaturated solutions of inorganic substances whose solubility is an increasing function or a decreasing function of the temperature.

In an advantageous embodiment of the plant according to the invention, the distributor is made up of vertical or oblique nozzles joining two transverse plates through which they pass, the plates joining the vertical tube and the wall of the tubular enclosure to define a chamber connected to a source of a heat-transfer fluid (for example water or steam) forming the thermostat.

In the process and the plant according to the invention, the fluidized bed performs a dual function. Firstly, it forms a crystallization environment; secondly, it produces a particle size classification of the crystals, which distribute themselves in the bed in layers or strata of equal particle size.

The process and the plant according to the invention allow an inorganic substance to crystallize in the form of uniform particles of approximately spherical shape. These are generally monolithic beads, which means that they are single, unagglomerated blocks of the inorganic substance. The process and the plant according to the invention find an especially advantageous application for the production of sodium chloride crystals in the form of monolithic spherical beads whose diameter is greater than 3 mm, for example between 3 and 30 mm. Crystals of sodium chloride with a diameter of between 5 and 10 mm find an advantageous application for the production of salt in the form of irregular particles and translucent and vitreous in appearance, using the technique described in document EP-A-162,490 (Solvay & Cie).

DESCRIPTION OF THE PREFERRED EMBODIMENTS

Individual features and details of the invention will emerge from the following description, with reference to the attached drawings.

Figure 1:
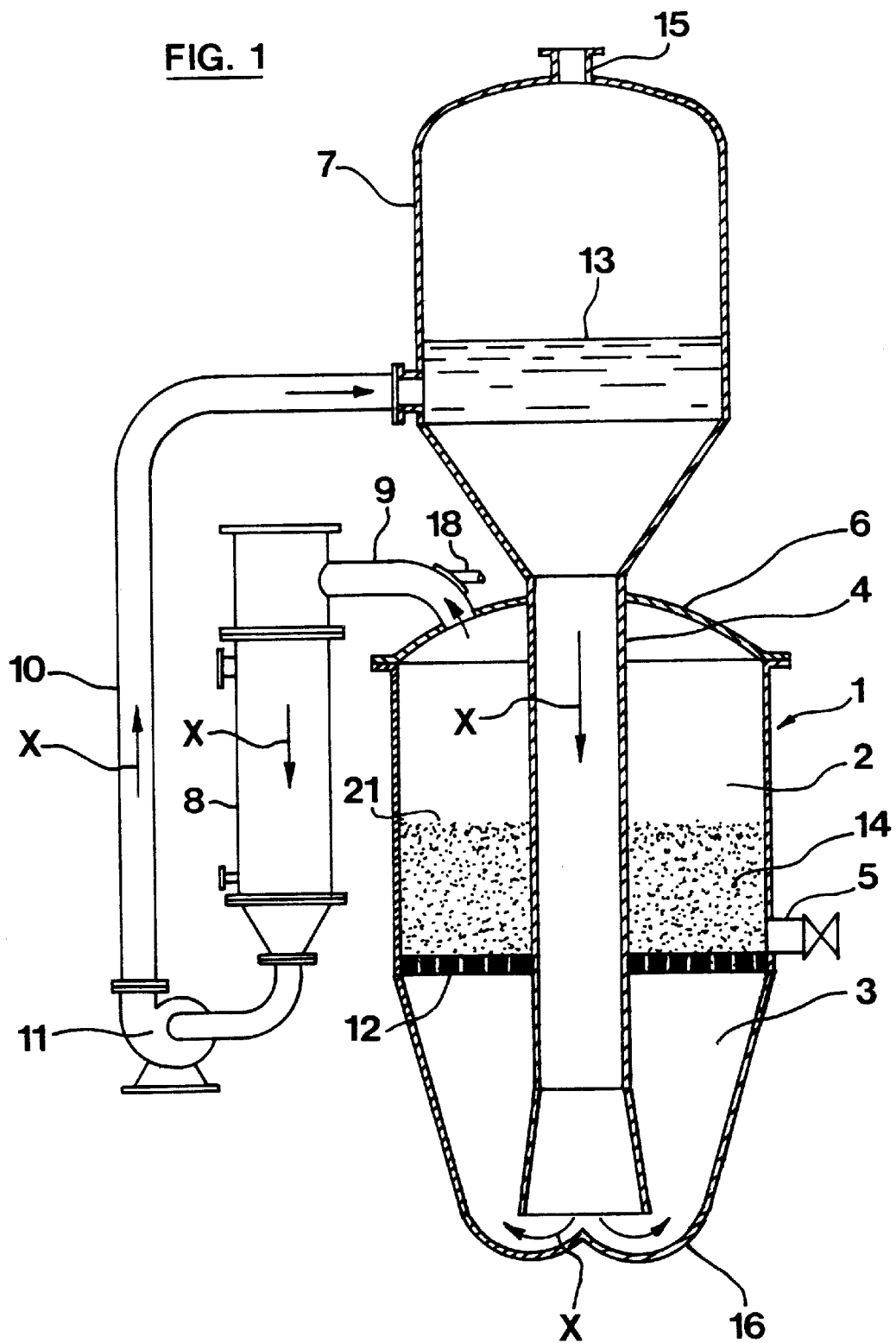
FIG. 1 shows, in vertical cross-section, a particular embodiment of the plant according to the invention.

The plant shown in FIG. 1 is a crystallizer of the "Oslo" type, modified in accordance with the invention. It comprises a vertical tubular enclosure 1 in which a vertical tube 4, whose lower part widens out, is arranged axially. In the enclosure 1 the tube 4 thus defines an annular chamber comprising a cylindrical upper section 2 and a frustoconical lower section 3 whose bottom 16 has the profile of a toric surface around an axial central cone. The enclosure 1 is closed by a cover 6 through which passes the tube 4 which opens into the decompression chamber 7. A reheater 8 is inserted between the head space of the upper section 2 and the decompression chamber 7, via conduits 9 and 10 and a circulation pump 11.

In accordance with the invention, the upper section 2 is intended to contain a bed of crystals 14 and to be used as a fluidized bed reactor. For this purpose, it is separated from the lower section 3 by a fluidized bed reactor distributor 12. In the plant of FIG. 1 the annular upper section 2 forms a crystallization chamber and the annular lower section 3 serves as an entry chamber for a solution supersaturated with an inorganic substance which it is desired to crystallize.

The plant shown in FIG. 1 is particularly suitable for the crystallization of sodium chloride in the form of spherical beads. For this purpose, the plant is filled with an aqueous solution of sodium chloride up to the level 13, in the decompression chamber 7, so that the crystallization chamber 2 is flooded. The latter also contains a bed of sodium chloride crystals 14 above the distributor 12.

When the plant is operating, the aqueous solution of sodium chloride is circulated in the direction of the arrows X by the pump 11. On leaving the chamber 2, via the conduit 9, the solution which is saturated with sodium chloride passes through the reheater 8, which raises its temperature, and then enters the decompression chamber 7, where it is partially vaporized by decompression, which results in its cooling and its supersaturation. The water vapour released is removed through an upper orifice 15 of the decompression chamber 7. The supersaturated aqueous solution descends vertically in the tube 4, enters the chamber 3 radially along the toric bottom 16, and then passes through the distributor 12 and enters the crystal bed 14, which it fluidizes in accordance with the invention. The solution is gradually desupersaturated while it passes through the fluidized bed 14, whose crystals consequently grow and distribute themselves in horizontal layers or strata, as a function of their particle sizes. The large particle size fractions move towards the bottom of the bed and are removed at regular intervals by a discharge conduit 5. The crystallization mother liquor arriving at the head space of the chamber 2 is an aqueous solution which is saturated (or slightly supersaturated) with sodium chloride. It is recycled into the reheater 8 via the conduit 9, where a complement of aqueous solution saturated with sodium chloride is added to it by means of a pipe 18. The complement of aqueous sodium chloride solution is controlled to compensate the quantity of sodium chloride which has crystallized in the bed 14 and the quantity of water removed by the evaporation in the decompression chamber 7.

While the plant is in use, in the manner described above, the distributor 12 is heated so that its wall in contact with the solution shall be at a temperature which is higher than the temperature of the supersaturated solution in section 3, upstream of the distributor 12.

The distributor 12 may be heated by any suitable means.

Figure 2:
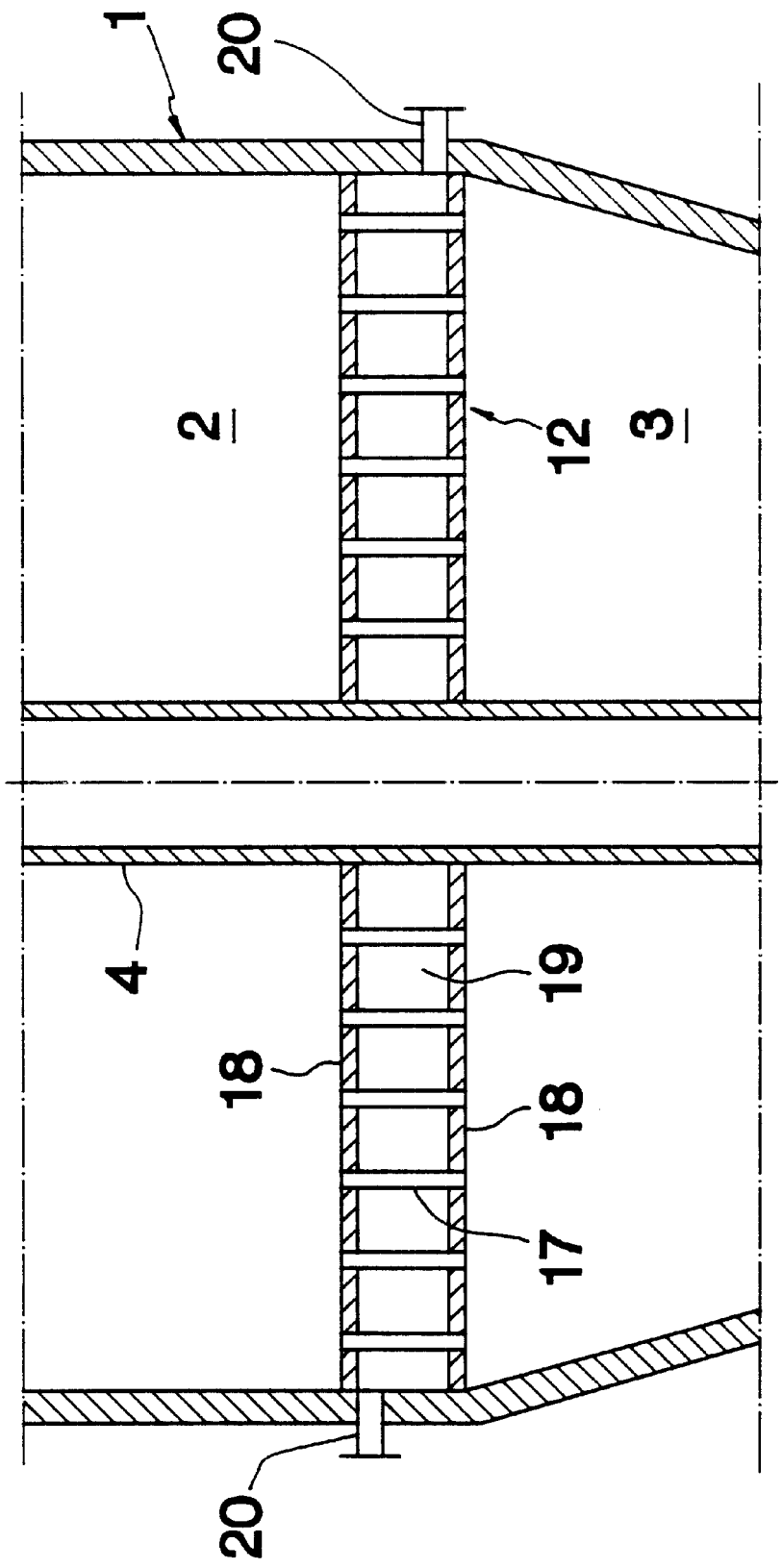
FIG. 2 shows, on a larger scale, a detail of the plant of FIG. 1.

FIG. 2 shows a particularly suitable embodiment of the distributor 12. The latter consists of a number of short vertical nozzles 17, joining two horizontal plates 18 through which they pass. The plates 18 are inserted between the axial tube 4 and the peripheral cylindrical wall of the upper chamber 2, so that they define a low annular chamber 19, through which the nozzles 17 pass. Two tubes 20 allow a heat-transfer fluid, for example steam, to be circulated through the chamber 19.

In the plant shown in FIGS. 1 and 2, the bottom 16 is heated in the same conditions as those which are imposed above in heating the distributor 12. To this end, it may be covered with a jacket carrying a hot fluid, generally steam.

In the plant shown in FIG. 1, the peripheral wall of the crystallization chamber 2 is cylindrical, so that the latter has a cross-section which is uniform throughout its height.

In a particular embodiment, not shown, of the plant according to the invention, the crystallization chamber 2 is shaped so that its cross-section widens from the bottom upwards, above the free surface 21 of the fluidized bed 14. In this embodiment of the invention, the purpose of the widening of the upper section of the crystallization chamber is to produce therein, above the fluidized bed 14, a solution velocity which is lower than the velocities prevailing in the chamber 3. In this way, the formation of an interfering fluidized bed in the chamber 3 under the distributor 12 is prevented. In the fluidized bed section 14, defined between the distributor 12 and the free surface 21 of the bed, the cross-section of the crystallization chamber 2 may be uniform or may decrease progressively from the bottom upwards.

In another embodiment, not shown, of the plant according to the invention, a device designed to retain the fine crystals which could be entrained in the solution leaving the enclosure 1 is inserted in the conduit 9. This device may, for example, consist of a settling chamber or a cyclone.

The following example is used to illustrate the invention.

A bed of approximately 3,000 kg of crystals of sodium chloride with a mean diameter of between 0.5 and 2 mm was introduced into the crystallization chamber (2) of an apparatus of the type described above with reference to FIGS. 1 and 2. The distributor (12) was heated with a stream of steam at 120° C. and into the entry chamber (3) was introduced an aqueous solution supersaturated with sodium chloride at approximately 110° C., propelled with a sufficient upward velocity to fluidize the crystal bed (14). The degree of supersaturation of the aqueous solution at the bottom of the bed was approximately 0.4 g/kg. The mother liquor collected on leaving the bed was treated in the reheater (8), where its temperature rose by approximately 1° C.; it was conveyed into the decompression chamber (7), where it was subjected to a decompression controlled to bring its temperature to approximately 110° C. and to produce the original degree of supersaturation (0.4 g/kg). The supersaturated solution was then recycled into the entry chamber (3) via the axial tube (4) as described above.

Crystals were withdrawn continuously at the base of the bed at a rate proportional to the planned production efficiency. At the same time, a complement of aqueous solution saturated with sodium chloride was introduced into the reheater (8) in a quantity controlled to compensate the sodium chloride withdrawn from the bed and the water vapour removed by the decompression.

Figure 3:
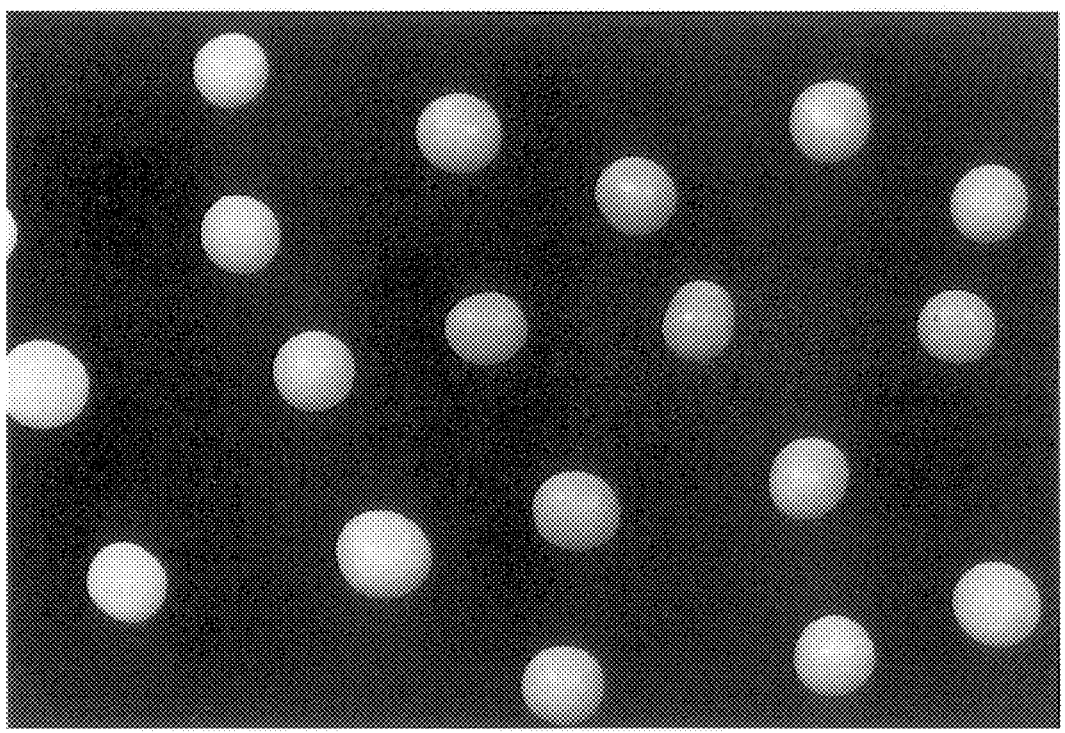
FIGS. 3 and 4 are photographic reproductions, on a scale of 1/1, of sodium chloride particles obtained by means of the process according to the invention.
Figure 4:
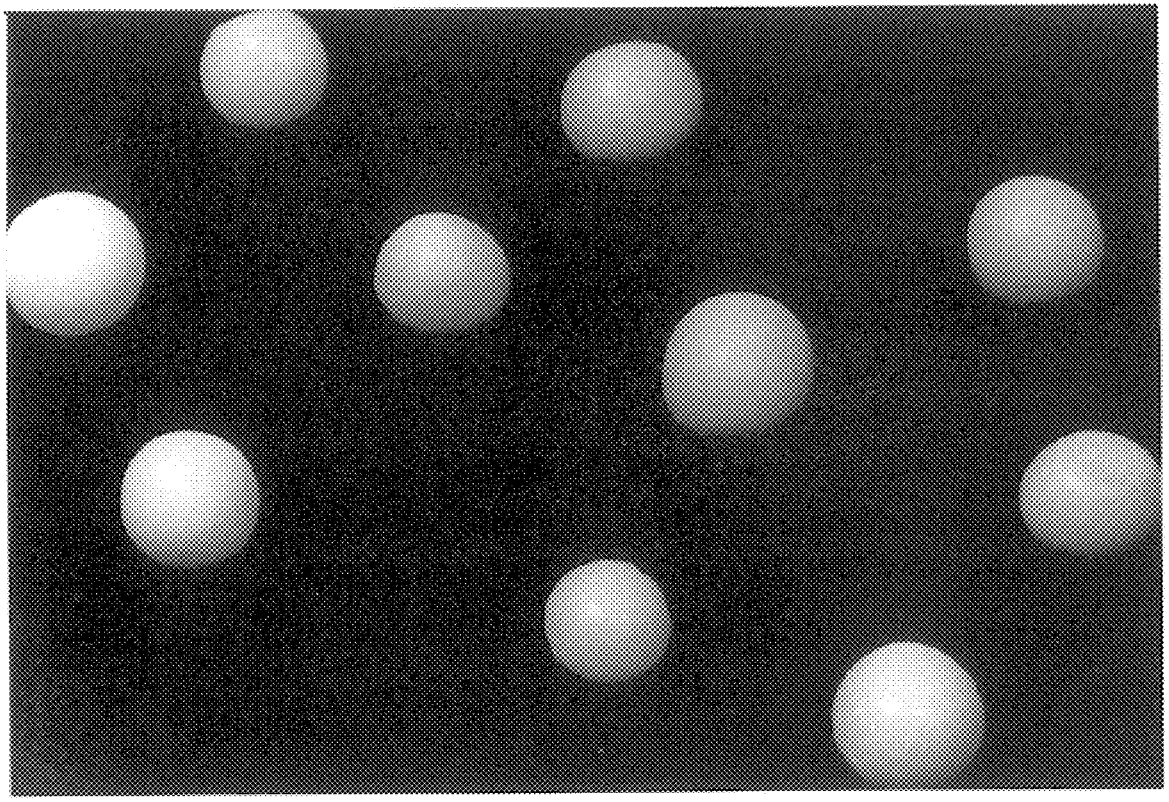

The photographs in FIGS. 3 and 4 show the crystals obtained in two successive stages of the test. These crystals are approximately spherical monolithic particles of sodium chloride, whose diameter is substantially between 10 and 15 mm (FIG. 3) and between 18 and 23 mm (FIG. 4).

What is claimed is:

1. A process for crystallization of an inorganic substance, comprising:
   a. preparing a supersaturated solution of the inorganic substance to be crystallized in a solvent which is a liquid;
   b. forcing a stream of said supersaturated solution upwardly through successively a fluidized bed distributor of a fluidized bed reactor and a bed of crystals arranged above said fluidized bed distributor with a pressure effective to cause fluidization of the bed of crystals, said fluidized bed distributor dividing the stream of supersaturated solution into thin, substantially parallel and vertical jets;

c. maintaining said fluidized bed distributor at a temperature which is uniform and at which the concentration of said inorganic substance to be crystallized from said supersaturated solution is lower than or equal to the concentration corresponding to saturation; and d. controlling the temperature of said fluidized bed distributor to cause the stream of supersaturated solution in the fluidized bed distributor to undergo a temperature change which is insufficient to desupersaturate it completely.

2. The process according to claim 1, wherein the solubility of the inorganic substance in the solvent increases with temperature, and wherein the fluidized bed distributor is maintained at a temperature above that of the solution.

3. The process according to claim 1, wherein a crystallization mother liquor is collected as the solution leaves the bed of crystals, wherein the crystallization mother liquor is heated, wherein a complementary quantity of the inorganic substance which is equal to that which has crystallized in the bed is added to the heated crystallization mother liquor to provide a mixture, and wherein the mixture is then cooled to reconstitute the supersaturated solution.

4. The process according to claim 3, wherein the mixture is cooled by subjecting the mixture to decompression to evaporate solvent therefrom partially, and wherein a quantity of solvent equal to that evaporated is added to the crystallization mother liquor.

5. The process according to claim 4, wherein the bed of crystals is a bed of sodium chloride crystals, and wherein the supersaturated solution is an aqueous solution supersaturated with sodium chloride.

6. A process for crystallization of an inorganic substance in a fluidized bed to provide monolithic spherical beads having a diameter of greater than 3 mm and reduced fines, the process comprising:

a. preparing a supersaturated solution of the inorganic substance to be crystallized in a solvent which is a liquid;

b. forcing a stream of the supersaturated solution upwardly through successively a fluidized bed distributor of a fluidized bed reactor and a bed of crystals arranged above the fluidized bed distributor, with a pressure effective to cause fluidization of the bed of crystals, the fluidized bed distributor dividing the stream of supersaturated solution into thin, substantially parallel and vertical jets;

c. maintaining the distributor at a temperature which is uniform and at which the concentration of the inorganic substance to be crystallized from the supersaturated solution is lower than or equal to the concentration corresponding to saturation whereby spontaneous crystallization of the inorganic substance onto the distributor is substantially prevented;

d. controlling the temperature of the distributor to cause the stream of supersaturated solution in the distributor to undergo a temperature change which is at most insufficient to desupersaturate it completely; and e. allowing crystallization to proceed and thereby provide monolithic spherical beads of the inorganic substance which have a diameter of greater than 3 mm, which diameter of greater than 3 mm is greater than that obtainable in a non-fluidized bed.

7. The process according to claim 6, wherein the solubility of the inorganic substance in the solvent increases with temperature, and wherein the distributor means is maintained at a temperature above that of the solution.

8. The process according to claim 6, wherein the solubility of the inorganic substance in the solvent decreases with temperature, and wherein the distributor means is maintained at a temperature below that of the solution.

9. The process according to claim 6, wherein a crystallization mother liquor is collected as the solution leaves the bed of crystals, wherein the crystallization mother liquor is heated, wherein a complementary quantity of the inorganic substance which is equal to that which has crystallized in the bed is added to the heated crystallization mother liquor to provide a mixture, and wherein the mixture is then cooled to reconstitute the supersaturated solution.

10. The process according to claim 9, wherein the mixture is cooled by subjecting the mixture to decompression to evaporate solvent therefrom partially, and wherein a quantity of solvent equal to that evaporated is added to the crystallization mother liquor.

11. The process according to claim 6, wherein the bed of crystals is a bed of sodium chloride crystals, and wherein the supersaturated solution is an aqueous solution supersaturated with sodium chloride.

12. A process for crystallization of an inorganic substance in a fluidized bed to provide monolithic spherical beads having a diameter of greater than 3 mm and reduced fines, the process comprising:

a. preparing a supersaturated solution of an inorganic substance to be crystallized in a solvent which is a liquid, which inorganic substance has a solubility which varies inversely with temperature;

b. forcing a stream of the supersaturated solution upwardly through successively a fluidized bed distributor of a fluidized bed reactor and a bed of crystals arranged above the fluidized bed distributor, with a pressure effective to cause fluidization of the bed of crystals, the fluidized bed distributor dividing the stream of supersaturated solution into thin, substantially parallel and vertical jets;

c. maintaining the fluidized bed distributor at a temperature which is uniform, which is less than that of the stream being forces therethrough, and at which the concentration of the inorganic substance to be crystallized from the supersaturated solution is lower than or equal to the concentration corresponding to saturation whereby spontaneous crystallization of the inorganic substance onto the fluidized bed distributor is substantially prevented;

d. controlling the temperature of the distributor to cause the stream of supersaturated solution in the distributor to undergo a temperature change which is at most insufficient to desupersaturate it completely; and e. allowing crystallization to proceed and thereby provide monolithic spherical beads of the inorganic substance which have a diameter of greater than 3 mm, which diameter of greater than 3 mm is greater than that obtainable in a non-fluidized bed.

13. The process according to claim 12, wherein a crystallization mother liquor is collected as the solution leaves the bed of crystals, wherein the crystallization mother liquor is heated, wherein a complementary quantity of the inorganic substance which is equal to that which has crystallized in the bed is added to the heated crystallization mother liquor to provide a mixture, and wherein the mixture is then cooled to reconstitute the supersaturated solution.

14. The process according to claim 13, wherein the mixture is cooled by subjecting the mixture to decompression to evaporate solvent therefrom partially, and wherein a quantity of solvent equal to that evaporated is added to the crystallization mother liquor.

\* \* \* \* \*